United States Patent
Wang et al.

(10) Patent No.: US 10,551,446 B2
(45) Date of Patent: Feb. 4, 2020

(54) MAGNETIC SENSOR FOR SUPERCONDUCTING QUANTUM INTERFERENCE DEVICE USING SINGLE OPERATIONAL AMPLIFIER

(71) Applicants: Shanghai Institute of Microsystem and Information Technology, Chinese Academy Of Sciences, Shanghai (CN); Forschungszentrum Julich GmbH, Julich (DE)

(72) Inventors: Yongliang Wang, Shanghai (CN); Yi Zhang, Julich (DE); Kai Chang, Shanghai (CN); Hans-Joachim Krause, Julich (DE); Xiaofeng Xu, Shanghai (CN); Yang Qiu, Shanghai (CN)

(73) Assignee: SHANGHAI INSTITUTE OF MICROSYSTEM AND INFORMATION TECHNOLOGY, CHINESE ACADEMY OF SCIENCES, Julich (DE)

( * ) Notice: Subject to any disclaimer, the term of this patent is extended or adjusted under 35 U.S.C. 154(b) by 455 days.

(21) Appl. No.: 15/327,100

(22) PCT Filed: Jun. 25, 2015

(86) PCT No.: PCT/CN2015/082289
§ 371 (c)(1),
(2) Date: Jan. 18, 2017

(87) PCT Pub. No.: WO2016/008352
PCT Pub. Date: Jan. 21, 2016

(65) Prior Publication Data
US 2017/0184689 A1    Jun. 29, 2017

(30) Foreign Application Priority Data
Jul. 18, 2014    (CN) .......................... 2014 1 0344300

(51) Int. Cl.
*G01R 33/035* (2006.01)

(52) U.S. Cl.
CPC .............. *G01R 33/0354* (2013.01)

(58) Field of Classification Search
CPC .................................................. G01R 33/0354
See application file for complete search history.

(56) References Cited

U.S. PATENT DOCUMENTS

| | | | | |
|---|---|---|---|---|
| 4,355,289 A | * | 10/1982 | Beyer | H03C 7/027 332/105 |
| 5,869,986 A | * | 2/1999 | Haque | H03D 1/10 327/307 |

(Continued)

FOREIGN PATENT DOCUMENTS

| CN | 102426343 A | 4/2012 |
|---|---|---|
| CN | 103616650 A | 3/2014 |

(Continued)

OTHER PUBLICATIONS

Translation of CN 102426343 (Year: 2012).*
Translation of CN 203720338 (Year: 2014).*
International Search Report, dated Sep. 15, 2015; Six (6) Pages.

*Primary Examiner* — Paul A Wartalowicz
(74) *Attorney, Agent, or Firm* — William H. Honaker; Dickinson Wright PLLC

(57) ABSTRACT

A magnetic sensor for superconducting quantum interference device using single operational amplifier comprising SQUID, a feedback coil, feedback resistor and an operational amplifier. The voltage signal of SQUID is delivered to one input of the operational amplifier, a bias voltage is delivered to other input of the operational amplifier, and the output of the operational amplifier connects to one end of a feedback resistor, the other end of the feedback resistor connects to a feedback coil that is coupled through mutual inductance with the SQUID so as to generate feedback (Continued)

magnetic flux, the output voltage of the operational amplifier drives the feedback resistance to generate current, thereby forming a flux locking loop. The present invention uses an open loop operational amplifier to implement SQUID magnetic flux locking feedback circuit which simplifies the circuit configuration, decrease the loop delay and thereby achieving higher bandwidth of the flux locking loop.

11 Claims, 5 Drawing Sheets

(56) References Cited

U.S. PATENT DOCUMENTS

| | | | | |
|---|---|---|---|---|
| 6,498,483 B1 * | 12/2002 | Hirano | ............... | G01R 33/0356 |
| | | | | 324/248 |
| 2006/0202699 A1 * | 9/2006 | Reiderman | .............. | G01V 3/28 |
| | | | | 324/339 |
| 2007/0030049 A1 * | 2/2007 | Yoshikawa | .............. | G01K 7/01 |
| | | | | 327/512 |

FOREIGN PATENT DOCUMENTS

| | | | | |
|---|---|---|---|---|
| CN | 203720338 | * | 7/2014 | ........... G01R 33/035 |
| JP | H075233 A | | 1/1995 | |
| KR | 20000067035 A | | 11/2000 | |
| WO | 2011029471 A1 | | 3/2011 | |

* cited by examiner

MAGNETIC SENSOR FOR SUPERCONDUCTING QUANTUM INTERFERENCE DEVICE USING SINGLE OPERATIONAL AMPLIFIER

CROSS REFERENCE TO RELATED APPLICATIONS

This application claims the benefit of PCT International Application Serial No. PCT/CN2015/082289 filed on Jun. 25, 2015, which claims priority to Chinese Application Serial No. 201410344300.1 filed on Jul. 18, 2014, the entire contents of which are incorporated by reference.

TECHNICAL FIELD

The present invention relates to a magnetic sensor for superconducting quantum interference device using single operational amplifier, especially to a readout circuit for superconducting quantum interference device, which belongs to the field of circuit technology.

BACKGROUND

Magnetic sensor constructed by using superconducting quantum interference device (hereinafter referred to as SQUID) is a currently known magnetic sensor with the highest sensitivity. It is widely used in the field of detecting weak magnetic field such as biological magnetic field, earth magnetic field abnormity, extremely low field nuclear magnetic resonance, the magnetic field detection sensitivity thereof can be measured by fT ($10^{-15}$ tesla). It is an important magnetic sensor in the field of extremely weak magnetic field detection and research. Signal response of SQUID device can be varied from DC (0 Hz) to GHz and has characteristics of high speed and high bandwidth. Furthermore, since SQUID chip is prepared by using microelectronic technology, it has unique advantages of small size and integration. It is widely used in multi channel, the high resolution detection system, such as in the magneto cardiogram instrument using 64 channels and magneto encephalography instrument using more than 200 channels of SQUID.

Direct-current superconducting quantum interference device (referred to as DC SQUID) is constructed by two superconducting Josephson junction in parallel connection to form a superconducting ring. Drawing wire from the two terminals of Josephson junction forms a two terminal element. When a bias current is applied across SQUID, the voltage across the SQUID will vary as a function of magnitude of external magnetic flux detected by superconducting ring due to superconducting quantum effect and Josephson Effect. Since the output voltage of SQUID assumes a non-linear relation with the detected magnetic flux thereof, people cannot obtain the magnitude of magnetic flux by directly measure of voltage across SQUID. Therefore, practical SQUID magnetic sensor is implemented by a flux-locked loop (hereinafter referred to as FLL) comprising a SQUID device and an amplifier circuit. Such flux-locked loop is referred to as SQUID readout circuit.

A typical SQUID flux-locked loop introduced in document [D. Drung and M. Mück, *The SQUID Handbook*, vol. 1, J. Clarke and A. I. Braginski, Ed. Weinheim: Wiley-VCH, pp. 128-155, 2006.] is shown in FIG. 1. Firstly, a bias current $I_b$ is applied to SQUID to achieve maximal flux-voltage transfer rate. The SQUID voltage signal is delivered to a preamplifier to amplify it. Meanwhile, bias voltage $V_b$ is adjusted to keep the DC component of the output voltage of SQUID to be zero when SQUID has maximal flux-voltage transfer rate. At this time, the current value status of the bias current $I_b$, the bias voltage $V_b$ and the applied flux $\Phi_a$ are referred to as operating point. The output of the preamplifier is delivered to integrator to integrate, the output of the integrator drives a feedback resistor to inject feedback current into a feedback coil, mutual inductance by the feedback coil and SQUID generates feedback flux coupled to SQUID.

The operation principle of the flux-locked loop is: provided the flux-locked loop maintains a stable operating point for SQUID, when the tested flux has a variation $\Delta\Phi$, SQUID generates a voltage variation $\Delta V$ deviating from the operating point, the voltage variation $\Delta V$, after being amplified by the preamplifier, is delivered to the integrator to integrate, the output voltage of the integrator is adjusted. The feedback flux is adjusted by the feedback resistor and the feedback coil to counteract the above mentioned flux variation, making the voltage of SQUID input to the integrator at the operating point to be zero, thus the integrator stops integrating and the loop becomes stable. The stable status of the operating point is referred to as readout circuit lock. Under the lock state, the output voltage $V_f$ of the flux-locked loop will be in proportion to external magnetic flux variation sensed by SQUID [D. Drung "High-Tc and low-Tc dc SQUID electronics" *Supercond. Sci. Technol.* 16 1320-1336 (2003).], i.e. $Vf=\Delta\Phi \cdot R_f/M_f$, wherein $\Delta\Phi$ is magnetic flux variation sensed by SQUID, $R_f$ is feedback resistance, $M_f$ is mutual inductance by the feedback coil and SQUID.

It thus can be seen, SQUID magnetic sensor is a negative feedback based flux-locked loop. Since the output signal from SQUID is relative small, the conventional negative feedback circuit is based on PID (P proportion, I integral, D differential) principle, i.e. firstly using a proportional amplifier to amplify the output signal from SQUID, then using an integrator circuit for eliminating error to drive flux feedback circuit. The function of the integrator is to make the output voltage of the SQUID temporarily departure from the operating point when the input flux changes, then integrator starts to integrate and modulate the output voltage, until the feedback flux driven by the output voltage counteracts the change of the input flux, consequently, the flux-locked loop resume to stable balance. Therefore, the integrator in the flux-locked loop is used to accumulate error, modulate output voltage until the error is eliminated.

That is to say, the conventional SQUID flux-locked loop typically uses preamplifier to perform low-noise amplification for weak voltage signal of SQUID and then the amplified signal is delivered to the integrator to perform integral feedback. Therefore, the conventional SQUID flux-locked loop is constituted by at least one preamplifier and one integrator cascade d circuit connected with feedback resistor and feedback coil. In practical application, the SQUID flux-locked loop employing integrator has several drawbacks:

1) Limited bandwidth. The readout circuit employing integrator uses more than two amplifier stages, which increases time-delay of the loop signal and makes high frequency signal have phase-shift, thus causing loop oscillation [D. Drung and M. Mück, *The SQUID Handbook*, vol. I, J. Clarke and A. 1. Braginski, Ed. Weinheim: Wiley-VCH, pp. 128-155, 2006.]. For this reason, the integral capacitance must be increased to eliminate oscillation and realize stable operation of the flux-locked loop. As the integral capacitance increases, the bandwidth of the flux-locked loop narrows. Thus the tracking speed of the flux-locked loop is slow and cannot follow the change of the input signal, which causes the lock failure will easily occur and the system cannot operate properly.

2) Limited slew-rate. The output of the integrated circuit is the result of the time integral of the input signal. When the detected signal changes suddenly, the integrator cannot respond instantly, thus causing a limited slew-rate of the sensor voltage output. It is difficult to meet the requirements for detecting high slew-rate magnetic field.

3) It is needed to use at least two operational amplifiers and peripheral circuits which circuits are complex and cause large power consumption.

Therefore, the above readout circuit employing integrator limits the performance of SQUID magnetic sensor in terms of the bandwidth and slew-rate. Furthermore, the Multi-channel system presents higher requirements on miniaturization for SQUID magnetic sensor. Therefore, simplifying the design of SQUID readout circuit is of great significance and practical importance for the application of multi channel SQUID. The present invention seeks to settle these problems.

SUMMARY OF THE INVENTION

The purpose of the present invention is to provide a magnetic sensor for superconducting quantum interference device using single operational amplifier, to provide a negative feedback readout circuit having faster tracking speed and simpler design without lock failure.

SQUID has a higher response speed than a semiconductor amplifier and can form a stable negative feedback loop with the amplifier. Therefore, the conception of the present invention is only using single low noise operational amplifier, amplifying SQUID voltage signal in the manner of open-loop, and directly driving the feedback resistor and the feedback coil by an open-loop output from the single operational amplifier. In this way, the preamplifier and the integrator in the traditional flux locked loop are replaced with a single operational amplifier, thus providing a simpler SQUID flux locked loop.

According to one aspect of the present invention, a magnetic sensor for superconducting quantum interference device using single operational amplifier, comprising SQUID device and a first feedback resistor, wherein the SQUID device includes SQUID and a feedback coil, a bias current provided by a bias current source is applied to SQUID, the other end of the SQUID is grounded, characterized in that, the circuit further comprises an operational amplifier, the voltage signal of SQUID is delivered to one input of the operational amplifier, a bias voltage is delivered to other input of the operational amplifier, the output of the operational amplifier connects to one end of the first feedback resistor, the other end of the feedback resistor connects to a feedback coil that is coupled through mutual inductance with the SQUID so as to generate feedback magnetic flux, the output voltage of the operational amplifier drives the feedback resistance to generate current, thereby forming a flux locking loop.

The voltage signal of the SQUID is delivered to the positive or negative input of the operational amplifier, and the bias voltage is consequently delivered to the negative input or the positive input of the operational amplifier respectively.

The bias current is provided by a bias current adjusting circuit that comprises a first adjustable potentiometer constituted by an adjustable resistor with three terminals, wherein the terminals 1 and 2 of the potentiometer are resistors with a constant resistance and connect to positive power supply and negative power supply respectively, the terminal 3 of the potentiometer is an adjustable resistor tap and the output thereof connects to a first voltage dividing resistor, and the other end of the first voltage dividing resistor is connected with the SQUID in series. Wherein the positive power supply varies from +5V to +15V, the negative power supply varies from −5V to −15V and the resistance value across the first adjustable potentiometer is between 10K ohm and 100K ohm.

The bias voltage is provided by a bias voltage adjusting circuit that comprises a second adjustable potentiometer constituted by an adjustable resistor with three terminals, the terminals 1 and 2 of the potentiometer are fixed terminals and connect to positive power supply and negative power supply respectively, the terminal 3 of the adjustable potentiometer is a tap that connects to one end of the current limiting resistor, the other end of the current limiting resistor is connected with a second voltage dividing resistor in series, the other end of the resister is grounded, a divided voltage is provided as a bias voltage signal at the connection node between the current limiting resistor and the second voltage dividing resistor. Wherein the adjusting range of the bias voltage is +/−100 uV, the resistance value of the second voltage dividing resistor is between 1Ω and 10Ω and the resistance value of the current limiting resistor is between 10K Ω and 100K Ω.

The operational amplifier is a bipolar powered low noise operational amplifier which the voltage noise is 1 nV/√Hz, the open-loop gain is greater than 120 dB and the bandwidth gain product is more than 10 MHz.

Furthermore, the magnetic sensor comprise a reset switch with one end connecting to the negative input of the operational amplifier and the other end connecting to the output of the operational amplifier.

Moreover, the magnetic sensor comprising a second feedback resistor and a single pole double throw switch. The single pole double throw switch is provided with a fixed terminal that connects to the output of the operational amplifier; a first contact terminal that connects to one end of the second feedback resistor and the other end of the second feedback resistor connects to the negative input of the operational amplifier; and a second contact terminal that connects to the first feedback resistor.

According to the magnetic sensor of present invention, the resistance values of the first feedback resistor and the second feedback resistor are between 100Ω-10kΩ. The present invention only uses a single operational amplifier to realize the SQUID flux locking loop, which simplifies the circuit. By eliminating the integrator circuit in the conventional loop, the loop delay decreases, thereby achieving higher bandwidth of the flux locking loop. The direct output of the operational amplifier drives the feedback resistance and the feedback loop, which avoids the influence of the integral capacitance, in this way, the flux locking loop can achieve a higher slew rate. In addition, since the above circuit is constituted by a single operational amplifier and a few peripheral circuits, the circuit has small volume and low power consumption thereby greatly reducing overall volume and power consumption of the multi-channel SQUID sensor, which is important in the application of multi-channel SQUID.

DETAILED DESCRIPTION OF EMBODIMENTS

The present invention is a flux locked loop based on negative feedback principle, which uses an open-loop operational amplifier to construct the magnetic flux lock feedback circuit. The open-loop operational amplifier is a low noise and high gain operational amplifier with the magnification of open-loop approximating ten to the power of 8(th) ($10^8$), such as AD797. The present invention integrates the SQUID and the open-loop operational amplifier to directly construct an operational amplifier based negative feedback loop and then to realize the magnetic flux locking. According to the negative feedback principle of operational amplifier, in this case, the output voltage of the operational amplifier is linearly proportional with the input flux thereof. Thus the circuit has the linear flux-voltage conversion capability. That is to say, a novel magnetic sensor circuit with monolithic operational amplifier is provided.

Since the flux-voltage transmission characteristics of SQUID is periodic similar to the sine function, the SQUID can provide not only a positive slope (flux increasing and voltage increasing) operating point but also a negative slope (flux increasing and voltage decreasing) operating point. When SQUID integrates with the open-loop operational amplifier, both the positive terminal input and the negative terminal input can achieve negative feedback.

Figure 1:
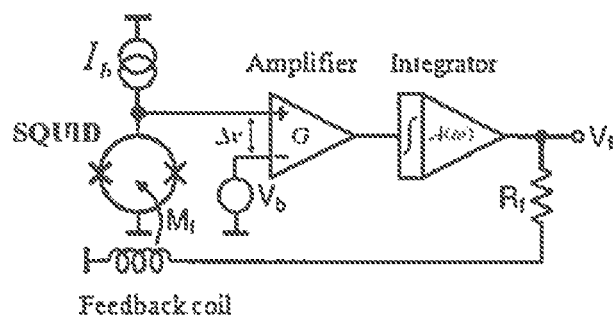
FIG. 1 shows principle of a typical direct readout circuit.
Figure 2:
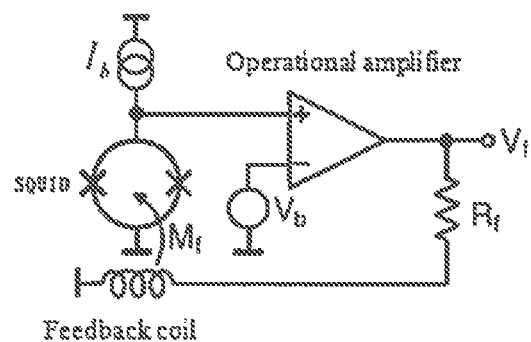
FIG. 2 shows principle schematic of a flux locking loop with SQUID in positive input to a single operational amplifier according to present invention.
Figure 3:
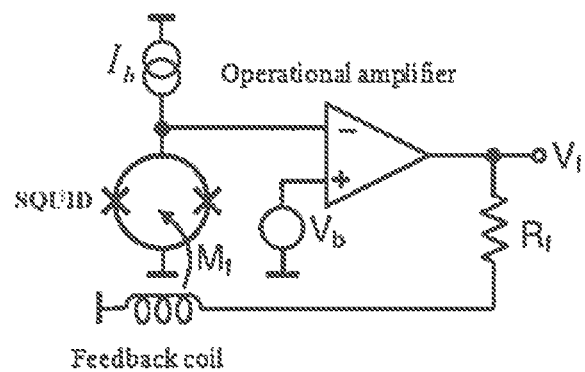
FIG. 3 shows principle schematic of a flux locking loop with SQUID in negative input to a single operational amplifier according to present invention.

Therefore, the flux-locked loop using an open loop operational amplifier according to the present invention provides two types of connection modes illustrated by FIG. 2 and FIG. 3.

The first type is positive input connecting mode, as shown in FIG. 2. The bias current $I_b$ provided by the bias current source is applied to SQUID, the voltage signal of SQUID is delivered to the positive input terminal of the operational amplifier. The bias voltage $V_b$ is delivered to the negative input terminal of the operational amplifier. The output terminal of the operational amplifier connects to one end of a feedback resistor $R_f$, the other end of the feedback resistor $R_f$ connects to a feedback coil, the feedback coil and the SQUID are coupled through mutual inductance, the output voltage $V_f$ of the operational amplifier drives the feedback resistance $R_f$ to generate current, and a feedback magnetic flux is generated by the mutual inductor $M_f$ between the feedback coil and the SQUID, thereby forming the flux locking loop.

The second type is negative input connecting mode, as shown in FIG. 3. The bias current $I_b$ provided by the bias current source is applied to SQUID, the voltage signal of SQUID is delivered to the negative input terminal of the operational amplifier. The bias voltage $V_b$ is delivered to the positive input terminal of the operational amplifier. The output terminal of the operational amplifier connects to one end of a feedback resistor $R_f$, the other end of the feedback resistor $R_f$ connects to a feedback coil, the feedback coil and the SQUID are coupled through mutual inductance, the output voltage $V_f$ of the operational amplifier drives the feedback resistance $R_f$ to generate current, and a feedback magnetic flux is generated by the mutual inductor $M_f$ between the feedback coil and the SQUID, thereby forming the flux locking loop.

The present invention will be more clearly understood by way of below embodiments with reference to the accompanying drawings.

Embodiment 1

Figure 4:
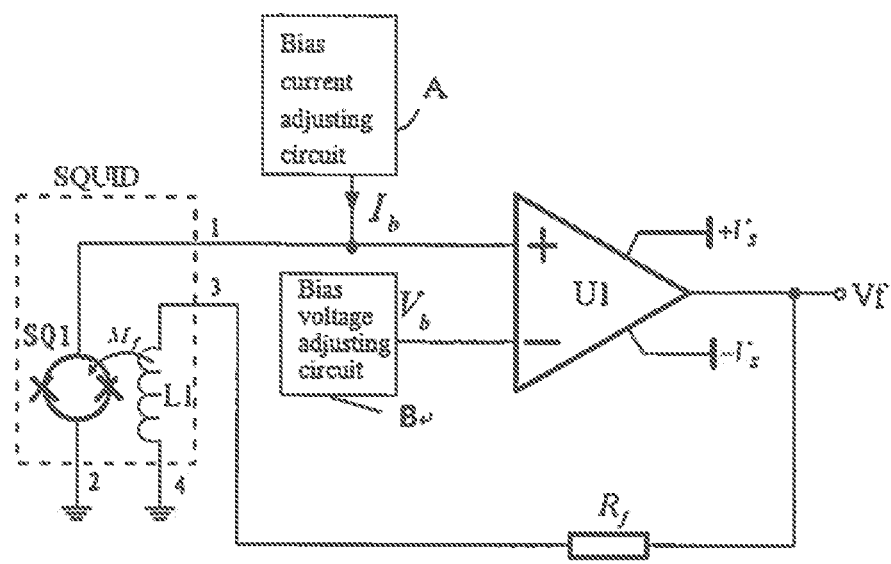
FIG. 4 shows an embodiment of the SQUID flux locking loop according to present invention.
Figure 4A:
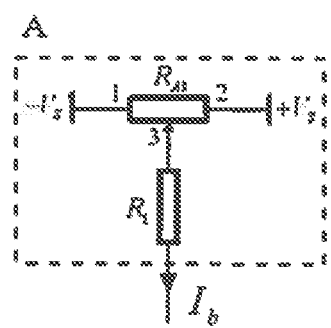
FIG. 4A and FIG. 4B represent bias current adjusting circuit and bias voltage adjusting circuit respectively.
Figure 4B:
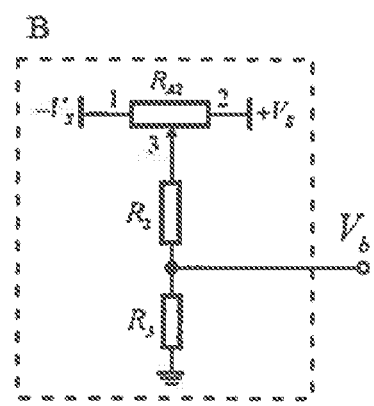

As shown in FIGS. 4, 4A and 4B, it is provided with a SQUID readout circuit using positive input connecting mode, which includes:

power supply +Vs and −Vs, which are bipolar power supply for whole circuit, i.e. the positive terminal of power supply +Vs connects to the positive voltage power supply and the negative terminal of power supply −Vs connects to the negative voltage power supply. The positive power supply +Vs varies from +5V to +15V and the negative power supply varies from −5V to −15V.

SQUID bias current adjusting circuit A, which connects to one end of the SQUID device in series. The other end of the SQUID is grounded. The output voltage terminal of the SQUID provided with bias current $I_b$ is connected to the positive input terminal of the operational amplifier U1, to apply an adjustable bias current to SQUID in order to flow to two Josephson junction of SQUID. By adjusting the magnitude of the bias current applied to SQUID, SQUID achieves the best flux-voltage conversion characteristic. The embodiment of the adjustable bias current circuit is shown as FIG. 4A. An adjustable potentiometer $R_{A1}$ is an adjustable resistor with three terminals, wherein the terminals 1, 2 of the potentiometer are resistors with a constant resistance and the value which is preferably 10K ohm to 100k ohm. The terminal 3 of the potentiometer is an adjustable resistor tap. The terminals 1, 2 of the potentiometer $R_{A1}$ connect to the positive power supply +Vs and the negative power supply −Vs individually. The terminal 3 of the potentiometer $R_{A1}$ outputs a voltage division of the potentiometer resistance, and an adjustable voltage is generated by adjusting the position of the potentiometer tap. The voltage output is connected to the resistor R1, and the other end of the resistor R1 is connected with the SQUID in series as the output terminal of the bias current source. The resistance of the resistor R1 varies between 50k ohm and 200k ohm. A DC bias current in the range of ±100 uA can be produced by adjusting the adjustable potentiometer $R_{A1}$.

SQUID bias voltage adjusting circuit B, which is used to generate an adjustable DC voltage to deliver to the negative input terminal of the operational amplifier. The voltage is adjusted to make it equal to the DC voltage at the SQUID operating point to realize a zero-point adjustment. The embodiment of the adjustable bias voltage circuit is shown in FIG. 4B. An adjustable potentiometer $R_{A2}$ is an adjustable resistor with three terminals, wherein the terminals 1, 2 of the potentiometer are resistors with a constant resistance and the value of which is preferably 10K ohm to 100k ohm. The terminals 1, 2 of the potentiometer $R_{A2}$ connect to the positive power supply +Vs and the negative power supply −Vs respectively. The adjustable resistor tap terminal 3 outputs a voltage division of the resistance, said voltage is delivered to one end of the current limiting resistor $R_2$, the other end of the resistor $R_2$ connects with voltage dividing resistor $R_3$ in series, while the other end of $R_3$ is grounded. At a connection node between R2 and R3, the divided voltage is provided as bias voltage signal $V_b$. The adjusting range of the bias voltage is ±100 uV. In order to decrease thermal noise introduced at the input of the operational amplifier, the resistor $R_3$ is typically provided between 1 ohm and 10 ohm. The resistor $R_2$ is provided between 10k ohm and 100k ohm for convening the voltage into the current flowing into the resistor.

SQUID device SQ1, which includes SQ1 and feedback coil L1. Wherein SQ1 is a two-terminal device using low temperature DC superconducting quantum interference device (operating under liquid helium temperature of 4.2K) or high temperature DC superconducting quantum interference device (operating under liquid helium temperature of 77K) and. One terminal of SQ1 connects to the positive input of the operational amplifier and the current output of the bias current circuit B1. The other terminal of SQ1 is grounded. While feedback coil L1 is provided with mutual inductance coupling with SQUID and the value of mutual inductance is Mr. The feedback coil converts the current generated by the feedback loop into a feedback magnetic flux that is coupled into the SQUID, to form a counteract magnetic flux. One end of the feedback coil L1 connects to the feedback resistor $R_f$ and the other end of the feedback coil L1 is grounded.

operational amplifier U1, which is a bipolar powered low noise operational amplifier, including two voltage signal inputs, i.e. positive input and negative input, and one voltage signal amplification output. As shown in FIG. 4, the positive input of the operational amplifier connects to the voltage output of SQUID; the negative input thereof connects to the bias voltage output. The output of the operational amplifier is the output of the flux locking loop, i.e. the output of the entire sensor, and connects to a feedback resistor $R_f$. In order to achieve low noise amplification of SQUID voltage signal and high linearity output of the flux locking loop, the operational amplifier device of the present invention preferably employs devices with low input voltage noise, high bandwidth and high open-loop gain characteristics that the voltage noise of the amplifier is about 1 nV/√Hz, the open-loop gain thereof is greater than 120 dB, the bandwidth gain product is more than 10 MHz. The commonly used low noise operational amplifiers include AD797 commercially available from American ADI Company and LT1028 commercially available from Linear Technology Company.

Feedback resistor $R_f$, one end of which connects to the output of the operational amplifier U1 and the other end thereof connects to the feedback coil L1. The feedback resistor $R_f$ converts the amplifier output voltage into feedback current that is input into the feedback coil, thereby generating feedback flux. The resistance of $R_f$ varies between 100 ohm and 10k ohm.

The circuit is an embodiment of the positive input connecting mode as shown in FIG. 2. According to the principle of SQUID flux locked loop, this circuit is a part of negative feedback circuit, which generates negative feedback flux counteracting the input flux. The output voltage $V_f$ of the operational amplifier drive resistance Rf to generate a current flowing into the feedback coil, then the feedback coil generates magnetic flux coupling into the SQUID loop to counteracts the external input flux change and finally to make the SQUID output voltage decrease back to the operating point.

Embodiment 2

Figure 5:
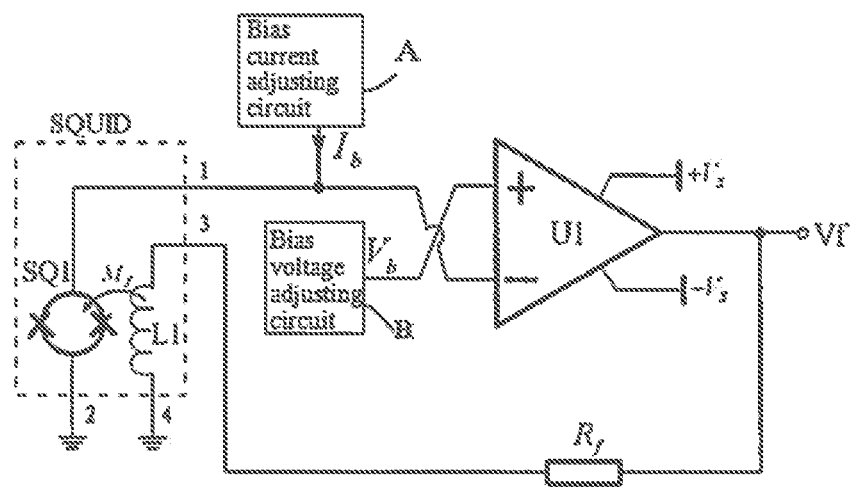
FIG. 5 shows the second embodiment of the SQUID flux locking loop according to present invention.

As shown in FIG. 5, it is provided with a SQUID readout circuit using negative input connecting mode. Except that the SQUID voltage signal is delivered to the negative input of the operational amplifier U1 and the bias voltage signal is delivered to the positive input of the operational amplifier, the rest of the circuit connections are the same as those in embodiment 1.

The circuit is an embodiment of the negative input connecting mode as shown in FIG. 3. Compared with embodiment 1, this circuit merely changes over the positive input and the negative input.

Embodiment 3

Figure 6:
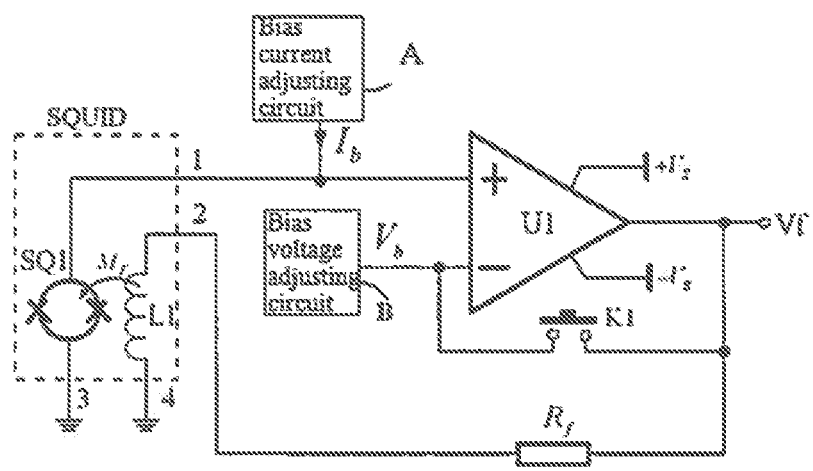
FIG. 6 shows the third embodiment of the SQUID flux locking loop according to present invention.

As shown in FIG. 6, it is provided with a SQUID readout circuit using positive input connecting mode which is an embodiment of the positive input connecting mode as shown in FIG. 2. Due to the external disturbance, the flux locking loop will fail to lock and cause the output overflow. In this circumstance, the flux locking loop is considered to use a reset switch K1 to restore the lock and zero reset. One end of K1 connects to the negative input of the operational amplifier U1 and the other end of K1 connects to the output of the operational amplifier U1. When the reset switch closes, the potential of the output of the operational amplifier U1 is the same as the potential of the negative input thereof. The operation mode of the operational amplifier changes from open loop high gain amplification to unit gain amplification, the output thereof decreases quickly and the circuit is reset. When the reset switch is off, the circuit is relocked.

Embodiment 4

Figure 7:
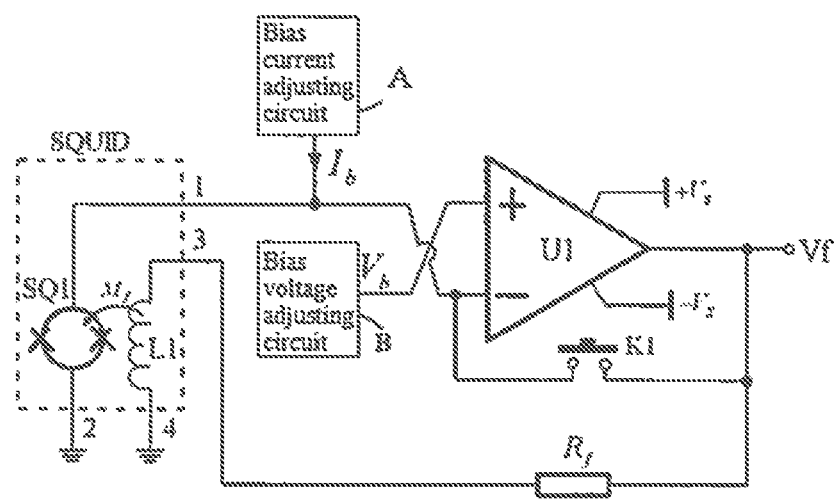
FIG. 7 shows the forth embodiment of the SQUID flux locking loop according to present invention.

As shown in FIG. 7, it is provided with a SQUID readout circuit using negative input connecting mode which is an embodiment of the negative input connecting mode as shown in FIG. 3.

Except that the SQUID voltage signal is delivered to the negative input of the operational amplifier U1 and the bias voltage signal is delivered to the positive input of the operational amplifier, the rest of connections of the circuit are the same as those in embodiment 3.

The embodiment 3 and 4 are actually adding a reset circuit based on the embodiment 1 and 2 respectively.

Embodiment 5

Figure 8:
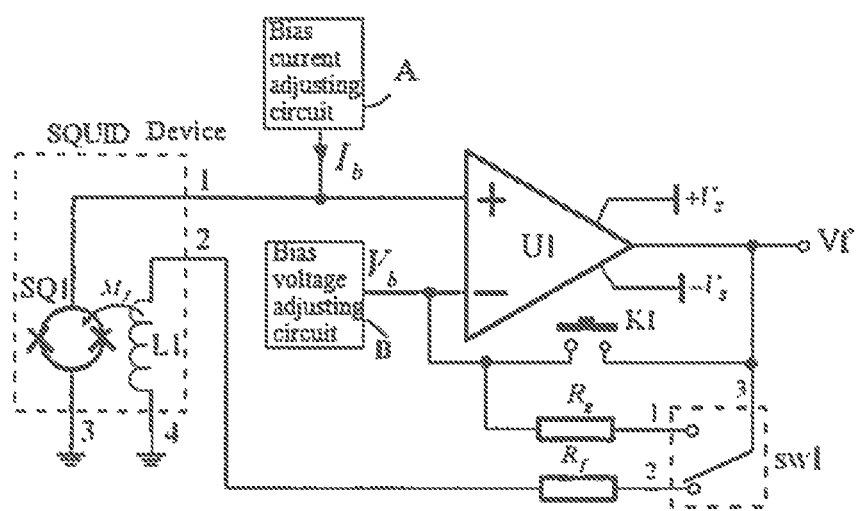
FIG. 8 shows the fifth embodiment of the SQUID flux locking loop according to present invention.

As shown in FIG. 8, it is provided with a SQUID readout circuit using positive input connecting mode C which is an embodiment of the positive input connecting mode as shown in FIG. 2.

When the SQUID magnetic sensor is power on, it is needed to re-adjust the bias current and the bias voltage so that SQUID can obtain the best operating point. Compared with embodiment 3, the embodiment 5 further comprises a feedback resistor $R_g$ and a single pole double throw Switch SW1 to provide the flux locking loop with operating point debugging function. The single pole double throw Switch has three connection terminals, wherein the terminal 3 is defined as a single pole fixed terminal, the terminal 1 is defined as first contact terminal and the terminal 2 is defined as second contact terminal. The single pole fixed terminal 3 of SW1 connects to the output of the operational amplifier U1. The terminal 1 of SW1 connects to one end of the resistor $R_g$, while the other end of $R_g$ connects to the negative input of the operational amplifier U1. The terminal 2 of SW1 connects to one end of the feedback resistor $R_f$, while the other end of the feedback resistor $R_f$ connects to the feedback coil L1. When the single pole switch of SW1 disconnects from the second contact and connects with the first contact, the resistor $R_g$ connects to the output of the operational amplifier U1. At this time, the flux locking loop operates under open-loop mode and the operational amplifier U1 operates under proportional amplification mode thereby realizing proportional amplification of the SQUID voltage signal. The output voltage $V_f$ of the operational amplifier is monitored to observe flux voltage transfer characteristic curve thereby facilitating the adjustments of the SQUID operating point, the bias current and the bias voltage. Having adjusted the optimal bias current and bias voltage, the single pole switch of SW1 disconnects from the first contact and connects with the second contact, thus the output of the operational amplifier U1 connects to feedback resistor $R_f$, and the flux locking loop thus has constant output.

Embodiment 6

Figure 9:
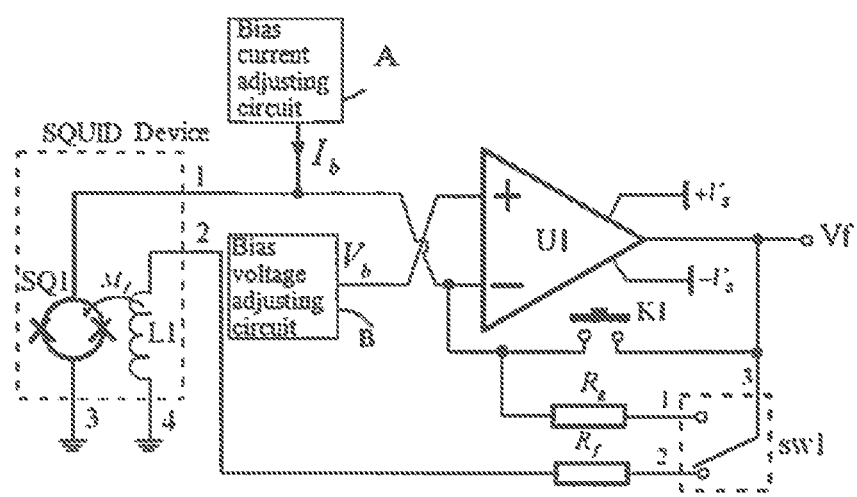
FIG. 9 shows the sixth embodiment of the SQUID flux locking loop according to present invention.

As shown in FIG. 9, it is provided with a SQUID readout circuit using negative input connecting mode which is an embodiment of the negative input connecting mode as shown in FIG. 3. Except that the SQUID voltage signals delivered to the negative input of the operational amplifier U1 and the bias voltage signal is delivered to the positive input of the operational amplifier, the rest of connections of circuit are the same as those in embodiment 5.

Embodiments 5 and 6 are optimized circuits of the embodiments 3 and 4 respectively based on the consideration that it is need to test the flux-voltage transmission characteristics of the SQUID so as to adjust the setting zero operating point in the practical application. Embodiments 5 and 6 incorporate a debugging circuit and can switch the open loop operational amplifier to proportional amplification mode through the switch over. Thus the signal from the SQUID is proportionally amplified so as to detect flux-voltage transmission characteristics of the SQUID device and to judge the device healthy or not as well as adjust the operating point in practice.

On the one hand, in FIG. 8 and FIG. 9, when the switch SW1 is connected to the second contact, it is actually the operating mode of embodiments 3 and 4, i.e. the normal negative feedback locked loop of operational amplifier.

On the other hand, when the switch SW1 is connected with the first contact, the feedback resistor $R_f$ disconnects from the output of the operational amplifier and the flux negative feedback function is invalid. When the output of the operational amplifier connects to $R_g$, the operational amplifier does not work under open loop mode but proportional amplification mode and amplify the voltage signal output from the SQUID. After the SQUID signal has been amplified, the voltage output characteristics of SQUID can be concluded by detecting the voltage output of the operation amplifier. In this way, it is easy to analyze the status of SQUID devices and adjust the operating point.

The present invention substantially relates to construct a negative feedback loop comprising integrated SQUID and operational amplifier. Without the limitation from the proportional amplifier and the integral capacitance but only with one parameter that is the open-loop gain of the open-loop operational amplifier, it allow full play of high speed performance of the operational amplifier to realize the response amplified directly and the system been stable quickly without integrator adjustment process. Therefore, the present invention can enhance the high-speed performance of the SQUID sensor and improve the ability of operating stably under different harsh magnetic fields environment in practical application.

The above embodiments are described by way of example only. Many variations are possible without departing from the scope of the invention as defined in the appended claims.

What is claimed is:

1. A magnetic sensor for superconducting quantum interference device using single operational amplifier, comprising SQUID device and a first feedback resistor, wherein the SQUID device includes SQUID and a feedback coil, a bias current provided by a bias current source is applied to SQUID, the other end of the SQUID is grounded, an operational amplifier, the voltage signal of SQUID is delivered to one input of the operational amplifier, a bias voltage is delivered to other input of the operational amplifier, the output of the operational amplifier connects to one end of the first feedback resistor, the other end of the feedback resistor connects to a feedback coil that is coupled through mutual inductance with the SQUID so as to generate feedback magnetic flux, the output voltage of the operational amplifier drives the feedback resistance to generate current, thereby forming a flux locking loop;

wherein the bias current is provided by a bias current adjusting circuit that comprises a first adjustable potentiometer constituted by an adjustable resistor with three terminals, wherein the terminals 1 and 2 of the potentiometer are resistors with a constant resistance and connect to positive power supply and negative power supply respectively, the terminal 3 of the potentiometer is an adjustable resistor tap and the output of the potentiometer connects to a first voltage dividing resistor, and the other end of the first voltage dividing resistor is connected with the SQUID in series;

wherein the positive power supply varies from +5V to +15V, the negative power supply varies from −5V to −15V and the resistance value across the first adjustable potentiometer is between 10K ohm and 100K ohm;

wherein the bias voltage is provided by a bias voltage adjusting circuit that comprises a second adjustable potentiometer constituted by an adjustable resistor with three terminals, the terminals 1, 2 of the potentiometer are fixed terminals and connect to positive power supply and negative power supply respectively, the terminal 3 of the adjustable potentiometer is a tap that connects to one end of the current limiting resistor, the other end of the current limiting resistor is connected with a second voltage dividing resistor in series, the other end of the second voltage dividing resistor is grounded, a divided voltage is provided as a bias voltage signal at the connection node between the current limiting resistor and the second voltage dividing resistor.

2. The magnetic sensor of claim 1, wherein the voltage signal of the SQUID is delivered to the negative input of the operational amplifier, and the bias voltage is delivered to the positive input of the operational amplifier.

3. The magnetic sensor of claim 2, wherein the operational amplifier is provided with that the voltage noise is 1 nV/√Hz, the open-loop gain is greater than 120 dB and the bandwidth gain product is more than 10 MHz.

4. The magnetic sensor of claim 1, further comprising a second feedback resistor and a single pole double throw switch, wherein the single pole double throw switch is provided with a fixed terminal that connects to the output of the operational amplifier; a first contact terminal that connects to one end of the second feedback resistor, the other end of the second feedback resistor connects to the negative input of the operational amplifier; and a second contact terminal that connects to the first feedback resistor.

5. The magnetic sensor of claim 4, wherein the resistance values of the first feedback resistor and the second feedback resistor are between 100Ω-10kΩ.

6. The magnetic sensor of claim 1, wherein the voltage signal of the SQUID is delivered to the positive input of the operational amplifier, and the bias voltage is delivered to the negative input of the operational amplifier.

7. The magnetic sensor of claim 1, wherein the adjusting range of the bias voltage is +/−100 uV, the resistance value of the second voltage dividing resistor is between 1Ω and 10Ω and the resistance value of the current limiting resistor is between 10K Ω and 100K Ω.

8. The magnetic sensor of claim 1, wherein the operational amplifier is a bipolar powered low noise operational amplifier.

9. The magnetic sensor of claim 1, further comprising a reset switch with one end connecting to the negative input of the operational amplifier and the other end connecting to the output of the operational amplifier.

10. A magnetic sensor for superconducting quantum interference device using single operational amplifier, comprising SQUID device and a first feedback resistor, wherein the SQUID device includes SQUID and a feedback coil, a bias current provided by a bias current source is applied to SQUID, the other end of the SQUID is grounded, an operational amplifier, the voltage signal of SQUID is delivered to one input of the operational amplifier, a bias voltage is delivered to other input of the operational amplifier, the output of the operational amplifier connects to one end of the first feedback resistor, the other end of the feedback resistor connects to a feedback coil that is coupled through mutual inductance with the SQUID so as to generate feedback magnetic flux, the output voltage of the operational amplifier drives the feedback resistance to generate current, thereby forming a flux locking loop; and a second feedback resistor and a single pole double throw switch, wherein the single pole double throw switch is provided with a fixed terminal that connects to the output of the operational amplifier; a first contact terminal that connects to one end of the second feedback resistor, the other end of the second feedback resistor connects to the negative input of the operational amplifier; and a second contact terminal that connects to the first feedback resistor.

11. The magnetic sensor of claim 10, wherein the resistance values of the first feedback resistor and the second feedback resistor are between 100Ω-10kΩ.

* * * * *